(12) United States Patent
Shin et al.

(10) Patent No.: US 9,299,654 B2
(45) Date of Patent: Mar. 29, 2016

(54) ANISOTROPIC CONDUCTIVE FILM COMPOSITION, ANISOTROPIC CONDUCTIVE FILM, AND SEMICONDUCTOR DEVICE

(71) Applicants: Kyoung Hun Shin, Uiwang-si (KR); Do Hyun Park, Uiwang-si (KR); Hyun Joo Seo, Uiwang-si (KR); Young Ju Shin, Uiwang-si (KR); Kang Bae Yoon, Uiwang-si (KR)

(72) Inventors: Kyoung Hun Shin, Uiwang-si (KR); Do Hyun Park, Uiwang-si (KR); Hyun Joo Seo, Uiwang-si (KR); Young Ju Shin, Uiwang-si (KR); Kang Bae Yoon, Uiwang-si (KR)

(73) Assignee: CHEIL INDUSTRIES, INC., Gumi-si, Kyeongsangbuk-do (KR)

( * ) Notice: Subject to any disclaimer, the term of this patent is extended or adjusted under 35 U.S.C. 154(b) by 297 days.

(21) Appl. No.: 13/713,404

(22) Filed: Dec. 13, 2012

(65) Prior Publication Data

US 2013/0154094 A1   Jun. 20, 2013

(30) Foreign Application Priority Data

Dec. 16, 2011   (KR) .................. 10-2011-0136330

(51) Int. Cl.

| | |
|---|---|
| *H01B 1/06* | (2006.01) |
| *H01B 1/24* | (2006.01) |
| *H01B 1/02* | (2006.01) |
| *H01B 1/22* | (2006.01) |
| *H01L 23/498* | (2006.01) |
| *H01B 1/20* | (2006.01) |
| *H01L 23/00* | (2006.01) |
| *C09J 7/02* | (2006.01) |
| *C09J 9/00* | (2006.01) |
| *C09J 11/08* | (2006.01) |
| *C08K 5/00* | (2006.01) |

(52) U.S. Cl.
CPC ............. *H01L 23/49883* (2013.01); *C09J 7/02* (2013.01); *C09J 9/00* (2013.01); *C09J 11/08* (2013.01); *H01B 1/20* (2013.01); *H01L 24/29* (2013.01); *C08K 5/00* (2013.01); *C08K 2201/001* (2013.01); *C09J 2201/602* (2013.01); *C09J 2203/326* (2013.01); *C09J 2205/102* (2013.01); *C09J 2423/04* (2013.01); *C09J 2475/00* (2013.01); *H01L 2224/293* (2013.01); *H01L 2224/2929* (2013.01); *H01L 2224/2939* (2013.01); *H01L 2224/29298* (2013.01); *H01L 2224/29339* (2013.01); *H01L 2224/29344* (2013.01); *H01L 2224/29347* (2013.01); *H01L 2224/29355* (2013.01); *H01L 2224/29393* (2013.01); *H01L 2224/29439* (2013.01); *H01L 2224/29444* (2013.01); *H01L 2224/29455* (2013.01); *H01L 2224/32225* (2013.01); *H01L 2924/07802* (2013.01); *H01L 2924/07811* (2013.01)

(58) Field of Classification Search
None
See application file for complete search history.

(56) References Cited

U.S. PATENT DOCUMENTS

| | | | | |
|---|---|---|---|---|
| 6,632,532 | B1 * | 10/2003 | Yamada et al. | 428/403 |
| 6,812,065 | B1 * | 11/2004 | Kitamura | 438/119 |
| 2004/0079464 | A1 * | 4/2004 | Kumakura | 156/60 |
| 2009/0152505 | A1 * | 6/2009 | Jeon et al. | 252/500 |
| 2010/0051878 | A1 * | 3/2010 | Akutsu et al. | 252/500 |
| 2010/0206623 | A1 | 8/2010 | Kawate et al. | |

FOREIGN PATENT DOCUMENTS

| | | | |
|---|---|---|---|
| KR | 10-2010-0014076 A | 2/2010 | |
| KR | 10-2010-0060173 A | 6/2010 | |
| KR | 10-2010-0100792 A | 8/2010 | |
| TW | 448550 B | 8/2001 | |
| WO | WO 2009/051980 A1 | 4/2009 | |
| WO | WO2009020005 A1 * | 12/2010 | 174/259 |

* cited by examiner

*Primary Examiner* — Evan Pert
*Assistant Examiner* — Shaka White
(74) *Attorney, Agent, or Firm* — Lee & Morse, P.C.

(57) ABSTRACT

A semiconductor device is bonded by an anisotropic conductive film composition. The anisotropic conductive film composition includes an ethylene-vinyl acetate copolymer, a polyurethane resin, and organic fine particles. The anisotropic conductive film composition has a melt viscosity of about 2,000 to about 8,000 Pa·s at 80° C.

7 Claims, No Drawings

ANISOTROPIC CONDUCTIVE FILM COMPOSITION, ANISOTROPIC CONDUCTIVE FILM, AND SEMICONDUCTOR DEVICE

BACKGROUND

1. Field

Embodiments relate to an anisotropic conductive film composition, a film including the composition, and a semiconductor device bonded by the composition and/or the film.

2. Description of Related Art

Generally, the term "anisotropic conductive films (ACFs)" refers to film-like adhesives in which conductive particles, such as metal particles including nickel or gold particles or metal-coated polymer particles, are dispersed in a resin, such as an epoxy resin. Anisotropic conductive films may include polymer layers having electric anisotropy and adhesive properties, to exhibit conductive properties in the thickness direction of the films and insulating properties in the surface direction thereof.

SUMMARY

According an embodiment, there is provided a semiconductor device bonded by an anisotropic conductive film composition, the anisotropic conductive film composition including an ethylene-vinyl acetate copolymer, a polyurethane resin, and organic fine particles, wherein the anisotropic conductive film composition has a melt viscosity of about 2,000 to about 8,000 Pa·s at 80° C.

The anisotropic conductive film composition may include about 5 to about 50 parts by weight of the ethylene-vinyl acetate copolymer, about 10 to about 70 parts by weight of the polyurethane resin, and about 0.1 to about 30 parts by weight of the organic fine particles, based on 100 parts by weight of a solid content of the anisotropic conductive film composition.

The organic fine particles may include organic fine particles of at least one of styrene-divinylbenzene, chlorinated polyethylene, dimethyl polysiloxane, methylmethacrylate-butylacrylate-dimethylsiloxane copolymers, styrene-butadiene-styrene block copolymers, styrene-butadiene thermoplastic elastomers, butadiene rubbers, styrene-butadiene rubbers, and ethylene glycidyl methacrylate.

According to an embodiment, there is provided a semiconductor device bonded by an anisotropic conductive film, the anisotropic conductive film including an ethylene-vinyl acetate copolymer, a polyurethane resin, and organic fine particles, wherein the anisotropic conductive film has an adhesive strength of about 1,000 gf/cm or more after pressing at 150° C. and 4 MPa for 4 seconds.

The organic fine particles may include organic fine particles of at least one of styrene-divinylbenzene, chlorinated polyethylene, dimethyl polysiloxane, methylmethacrylate-butylacrylate-dimethylsiloxane copolymers, styrene-butadiene-styrene block copolymers, styrene-butadiene thermoplastic elastomers, butadiene rubbers, styrene-butadiene rubbers, and ethylene glycidyl methacrylate.

The anisotropic conductive film may have an adhesive strength of about 800 gf/cm or more after pressing at 150° C. and 4 MPa for 4 seconds and then storage at 85° C. and 85% RH for 500 hours.

The anisotropic conductive film may have a bubble area of 10% or less based on an area of spaces between electrodes after pressing at 150° C. and 4 MPa for 4 seconds and then storage at 85° C. and 85% RH for 500 hours.

The anisotropic conductive film may have a melt viscosity of about 2,000 to about 8,000 Pa·s at 80° C.

According to an embodiment, there is provided an anisotropic conductive film composition, including an ethylene-vinyl acetate copolymer, a polyurethane resin, and organic fine particles, wherein the anisotropic conductive film composition has a melt viscosity of about 2,000 to about 8,000 Pa·s at 80° C.

The anisotropic conductive film composition may include about 5 to about 50 parts by weight of the ethylene-vinyl acetate copolymer, about 10 to about 70 parts by weight of the polyurethane resin, and about 0.1 to about 30 parts by weight of the organic fine particles, based on 100 parts by weight of a solid content of the anisotropic conductive film composition.

The organic fine particles may include organic fine particles of at least one of styrene-divinylbenzene, chlorinated polyethylene, dimethyl polysiloxane, methylmethacrylate-butylacrylate-dimethylsiloxane copolymers, styrene-butadiene-styrene block copolymers, styrene-butadiene thermoplastic elastomers, butadiene rubbers, styrene-butadiene rubbers, and ethylene glycidyl methacrylate.

The anisotropic conductive film composition may further include at least one of a thermoplastic resin, an acrylic copolymer, a radical polymerizable material, an organic peroxide, and conductive particles.

An anisotropic conductive film formed of the anisotropic film composition may have an adhesive strength of about 1,000 gf/cm or more after pressing at 150° C. and 4 MPa for 4 seconds.

An anisotropic conductive film formed of the anisotropic conductive film composition may have an adhesive strength of about 800 gf/cm or more after pressing at 150° C. and 4 MPa for 4 seconds and then storage at 85° C. and 85% RH for 500 hours.

An anisotropic conductive film formed of the anisotropic conductive film composition may have a bubble area of 10% or less based on an area of spaces between electrodes after pressing at 150° C. and 4 MPa for 4 seconds and then storage at 85° C. and 85% RH for 500 hours.

DETAILED DESCRIPTION OF THE INVENTION

Korean Patent Application No. 10-2011-0136330, filed Dec. 16, 2011, in the Korean Intellectual Property Office, and entitled: "Anisotropic Conductive Film Composition, Anisotropic Conductive Film, and Semiconductor Device," is incorporated by reference herein in its entirety.

Exemplary embodiments of the invention will now be described in detail. Details apparent to those skilled in the art will be omitted herein. And herein, the indefinite article "a", "an" and derivation thereof do not exclude a plurality.

According to an embodiment, a semiconductor device bonded by an anisotropic conductive film composition is provided, in which the anisotropic conductive film includes, an ethylene-vinyl acetate copolymer, a polyurethane resin, and organic fine particles, wherein the anisotropic conductive film composition has a melt viscosity of about 2,000 to about 8,000 Pa·s at 80° C.

Ethylene-Vinyl Acetate Copolymer

The ethylene-vinyl acetate (EVA) copolymer may include any suitable EVA copolymer. In the EVA copolymer, amounts of ethylene and vinyl acetate may be varied. For example, ethylene may be present in an amount of 20 to 60 parts by weight and vinyl acetate may be present in an amount of 40 to 80 parts by weight, based on 100 parts by weight of the copolymer.

Any suitable polymerization method for polymerizing the EVA copolymer may be used.

The EVA copolymer used herein may be, for example, an EVA copolymer dissolved at 40 vol % in toluene/methyl ethyl ketone (EVA 700, Bayer).

The EVA copolymer used herein may be present in an amount of about 5 to about 50 parts by weight, based on 100 parts by weight of the anisotropic conductive film composition in solid content, or, for example, 10 to 30 parts by weight. Within this range, the melt viscosity of the anisotropic conductive film composition at a low temperature may be controlled to a low level and thus, the anisotropic conductive film composition may exhibit excellent flowability.

Polyurethane Resin

The polyurethane resin used herein may include any suitable polyurethane resin. For example, the polyurethane resin used herein may be a polyurethane acrylate or a polyester urethane resin.

The polyurethane acrylate usable herein may be prepared from an isocyanate, acrylate, polyol and/or diol through polymerization.

The isocyanate may include aromatic, aliphatic, alicyclic diisocyanates, and combinations thereof. Examples of such isocyanates may include isophorone diisocyanate (IPDI), tetramethylene-1,4-diisocyanate, hexamethylene-1,6-diisocyanate, diphenylmethane diisocyanate, cyclohexylene-1,4-diisocyanate, methylene bis(4-cyclohexyl isocyanate), xylene diisocyanate, hydrogenated diphenylmethane diisocyanate, naphthalene diisocyanate, and 2,4- or 2,6-toluene diisocyanate, which may be used alone or in combination thereof. For example, aromatic diisocyanates may be used.

The acrylate may include hydroxy acrylates or amine acrylates, as examples.

The polyol or diol may include ethylene glycol, propylene glycol, hexanediol, neopentyl glycol, diethylene glycol, triethylene glycol, 1,3-propanediol, 1,3-butanediol, 1,4-butanediol, 1,5-pentanediol, 1,6-hexanediol, dipropylene glycol, dibutylene glycol, 2-methyl-1,3-pentanediol, 2,2,4-trimethyl-1,3-pentanediol, and 1,4-cyclohexanedimethanol, as examples.

Polymerization may be carried out by any suitable method. By way of example, polymerization may be carried out under the following conditions: methyl ethyl ketone may be used at 50 vol % as a solvent, the amount of the polyol may be 60 wt %, a molar ratio of hydroxy(meth)acrylate/isocyanate may be 1.0, and the polymerization reaction may be conducted at 90° C. and 1 atm for 5 hours using a catalyst such as dibutyltin dilaurate.

The polyester urethane resin usable herein may be obtained by a reaction of a polyester polyol and diisocyanate.

The term "polyester polyol" may refer to a polymer having an ester group and a hydroxyl group. Suitable polyester polyols may be obtained by a condensation reaction of a dicarboxylic acid compound and a diol compound. Examples of the dicarboxylic acid compound may include phthalic acid, terephthalic acid, isophthalic acid, adipic acid, sebacic acid, succinic acid, glutaric acid, suberic acid, azelaic acid, dodecanedicarboxylic acid, hexahydrophthalic acid, ortho-phthalic acid, tetrachlorophthalic acid, 1,5-naphthalenedicarboxylic acid, fumaric acid, maleic acid, itaconic acid, citraconic acid, mesaconic acid, and tetrahydrophthalic acid.

Examples of the diol may include ethylene glycol, propylene glycol, hexanediol, neopentyl glycol, diethylene glycol, triethylene glycol, 1,3-propanediol, 1,3-butanediol, 1,4-butanediol, 1,5-pentanediol, 1,6-hexanediol, dipropylene glycol, dibutylene glycol, 2-methyl-1,3-pentanediol, 2,2,4-trimethyl-1,3-pentanediol, and 1,4-cyclohexanedimethanol.

The diisocyanate may include aromatic, aliphatic, alicyclic diisocyanates and combinations thereof. Examples of diisocyanates may include isophorone diisocyanate (IPDI), tetramethylene-1,4-diisocyanate, hexamethylene-1,6-diisocyanate, diphenylmethane diisocyanate, cyclohexylene-1,4-diisocyanate, methylene bis(4-cyclohexyl isocyanate), xylene diisocyanate, hydrogenated diphenylmethane diisocyanate, naphthalene diisocyanate, and 2,4- or 2,6-toluene diisocyanate, which may be used alone or in combination thereof. For example, aromatic diisocyanates may be used.

The polyurethane resin used herein may be present in an amount of about 10 to about 70 parts by weight, based on 100 parts by weight of the anisotropic conductive film composition in solid content, or, for example, 20 to 50 parts by weight. If the amount of the urethane resin is more than 10 parts by weight, the film may exhibit sufficient adhesion. If the amount is less than 70 parts by weight, flowability deterioration of the film, which makes it difficult to maintain a stable connection, may be avoided.

Organic Fine Particles

The organic fine particles used herein may include any suitable organic fine particle. Examples of the organic fine particles may include fine particles of styrene-divinylbenzene, chlorinated polyethylene, dimethyl polysiloxane, methylmethacrylate-butylacrylate-dimethylsiloxane copolymers, styrene-butadiene-styrene block copolymers, styrene-butadiene thermoplastic elastomers, butadiene rubbers, styrene-butadiene rubbers, and ethylene glycidyl methacrylate, which may be used alone or in combination thereof.

For example, the organic fine particles may be fine particles of styrene-divinylbenzene or styrene-butadiene rubbers.

The organic fine particles may have a particle size of 0.1 to 20 μm, for example, 0.1 to 10 μm. Within this range, the organic fine particles may be suitably dispersed and it may be possible to reduce or prevent deterioration in preliminary pressing performance due to decreased tack of the film.

The organic fine particles may be present in an amount of about 0.1 to about 30 parts by weight, based on 100 parts by weight of the anisotropic conductive film composition in solid content, for example, in a range of about 1 to about 20 parts by weight. Within this range, the organic fine particles may have a sufficient effect and an excessive increase in toughness of the film may be prevented, thus avoiding tack decrease.

The anisotropic conductive film composition may further include a thermoplastic resin, an acrylic copolymer, a radical polymerizable material, an organic peroxide, and/or conductive particles in addition to the foregoing components.

Thermoplastic Resin

The thermoplastic resin may include any suitable thermoplastic resin. Examples of the thermoplastic resin may include at least one of acrylonitrile, phenoxy, butadiene, acrylic, polyurethane, urethane acrylate, polyamide, olefin, silicon, and nitrile butadiene rubber (NBR) resins.

The thermoplastic resin may have a weight average molecular weight of 1,000 to 1,000,000 g/mol. Within this range, suitable film strength may be obtained, phase separation may be prevented, and a reduction of adhesion due to a reduction in tack to an adherent may be prevented.

The thermoplastic resin may be present in an amount of 0 to 60 parts by weight, based on 100 parts by weight of the anisotropic conductive film composition in solid content, for example, 0 to 50 parts by weight. If the thermoplastic resin is present within this range, sufficient dispersibility of the organic and/or conductive particles may be secured in the composition and an unstable connection caused by excessively decreased flowability may be prevented.

Acrylic Copolymer

The acrylic copolymer may include any suitable acrylic copolymer. The acrylic copolymer may include acrylic copolymers obtained by polymerization of acrylic monomers, such as ethyl acrylates, methyl acrylates, propyl acrylates, butyl acrylates, hexyl acrylates, oxyl acrylates, dodecyl acrylates, lauryl acrylates, methacrylates, and modified acrylates thereof, acrylic acids, methacrylic acids, methyl methacrylates, vinyl acetates, and modified acrylic monomers thereof, as examples.

The acrylic copolymer may be present in an amount of 0 to 40 parts by weight, based on 100 parts by weight of the anisotropic conductive film composition in solid content, for example, 5 to 30 parts by weight. Within this range, excellent reworkability after preliminary pressing may be obtained, and separation in preliminary pressing due to weak tack caused by excessively enhanced hardness may be prevented.

Radical Polymerizable Material

The radical polymerizable material may include any suitable radical polymerizable material. For example, the radical polymerizable material may include acrylates, methacrylates, and maleimide compounds, which may be used as monomers, oligomers or combinations of monomers and oligomers.

Examples of the acrylates or methacrylates may include methyl acrylate, ethyl acrylate, isopropyl acrylate, isobutyl acrylate, ethylene glycol diacrylate, diethylene glycol diacrylate, trimethylolpropane triacrylate, pentaerythritol triacrylate, tetramethylol methane tetraacrylate, 2-hydroxy-1,3-diacryloxypropane, 2,2-bis[4-(acryloxypolymethoxy)phenyl]propane, 2,2-bis[4-(acryloxypolyethoxy)phenyl]propane, dicyclopentenyl acrylate, tricyclodecanyl acrylate, and tris(acryloyloxyethyl)isocyanurate. These acrylates or methacrylates may be used alone or in combination thereof. Further, acrylates or methacrylates having a phosphate ester structure, isocyanurate acrylates and bisphenol A epoxy acrylate resins may be used to improve adhesion and room temperature stability.

The maleimide compounds may include compounds containing at least two maleimide groups, for example, 1-methyl-2,4-bis maleimide benzene, N,N'-m-phenylene his maleimide, N,N'-p-phenylene his maleimide, N,N'-m-tolylene his maleimide, N,N'-4,4-biphenylene his maleimide, N,N'-4,4-(3,3'-dimethylbiphenylene)bis maleimide, N,N'-4,4-(3,3'-dimethyldiphenylmethane)bis maleimide, N,N'-4,4-(3,3'-diethyldiphenylmethane)bis maleimide, N,N'-4,4-diphenylmethane his maleimide, N,N'-4,4-diphenylpropane bis maleimide, N,N'-4,4-diphenyl ether bis maleimide, N,N'-3,3'-diphenylsulfone bis maleimide, 2,2-bis[4-(4-maleimidephenoxy)phenyl]propane, 2,2-bis[3-s-butyl-4-(4-maleimidephenoxy)phenyl]propane, 1,1-bis[4-(4-maleimidephenoxy)phenyl]decane, 4,4'-cyclohexylidene-bis[1-(4-maleimidephenoxy)-2-cyclohexyl]benzene, and 2,2-bis[4-(4-maleimidephenoxy)phenyl)hexafluoropropane, which may be used alone or in combination thereof.

The radical polymerizable material may be present in an amount of 1 to 40 parts by weight, based on 100 parts by weight of the anisotropic conductive film composition in solid content, for example, 5 to 20 parts by weight. Within this range, appropriate curing density may be maintained after final pressing to secure excellent reliability and overall flowability. Accordingly, contact between the conductive particles and circuit substrates may be improved, thereby providing excellent connection reliability.

Organic Peroxide

The organic peroxide usable herein may include any suitable organic peroxide.

Examples of the organic peroxide may include t-butylperoxylaurate, 1,1,3,3-t-methylbutyl peroxy-2-ethylhexanonate, 2,5-dimethyl-2,5-di(2-ethylhexanoyl peroxy)hexane, 1-cyclohexyl-1-methylethyl peroxy-2-ethylhexanonate, 2,5-dimethyl-2,5-di(m-toluoylperoxy)hexane, t-butyl peroxyisopropylmonocarbonate, t-butyl peroxy-2-ethylhexylmonocarbonate, t-hexyl peroxybenzoate, t-butyl peroxyacetate, dicumyl peroxide, 2,5-dimethyl-2,5-di(t-butylperoxy)hexane, t-butylcumylperoxide, t-hexyl peroxyneodecanoate, t-hexylperoxy-2-ethylhexanonate, t-butylperoxy-2-2-ethylhexanonate, t-butylperoxyisobutyrate, 1,1-bis(t-butylperoxy)cyclohexane, t-hexyl peroxyisopropylmonocarbonate, t-butylperoxy-3,5,5-trimethylhexanonate, t-butylperoxypivalate, cumylperoxy-neodecanoate, diisopropylbenzenehydroperoxide, cumene hydroperoxide, isobutylperoxide, 2,4-dichlorobenzoylperoxide, 3,5,5-trimethylhexanoylperoxide, octanoylperoxide, lauroylperoxide, stearoylperoxide, succinic peroxide, benzoylperoxide, 3,5,5-trimethylhexanoylperoxide, benzoylperoxytoluene, 1,1,3,3-tetramethylbutylperoxyneodecanoate, 1-cyclohexyl-1-methylethylperoxyneodecanoate, di-n-propylperoxydicarbonate, diisopropylperoxycarbonate, bis(4-t-butylcyclohexyl)peroxydicarbonate, di-2-ethoxymethoxyperoxydicarbonate, di(2-ethylhexylperoxy)dicarbonate, dimethoxy-butylperoxydicarbonate, di(3-methyl-3-methoxybutylperoxy)dicarbonate, 1,1-bis(t-hexylperoxy)-3,3,5-trimethylcyclohexane, 1,1-bis(t-hexylperoxy)cyclohexane, 1,1-bis(t-butylperoxy)-3,3,5-trimethylcyclohexane, 1,1-(t-butylperoxy)cyclododecane, 2,2-bis(t-butylperoxy)decane, t-butyltrimethylsilylperoxide, bis(t-butyl)dimethylsilylperoxide, t-butyltriallylsilylperoxide, bis(t-butyl)diallylsilylperoxide, and tris(t-butyl)allylsilylperoxide.

The organic peroxide may be present in an amount of 0.1 to 10 parts by weight, based on 100 parts by weight of the anisotropic conductive film composition in solid content. Within this range, excellent properties of final pressing may be obtained and increase in brittleness of the film after curing may be prevented, thus allowing the anisotropic conductive film to be completely removed during reworking.

Conductive Particles

The conductive particles usable herein may include any suitable conductive particle.

Examples of the conductive particles may include metal particles, for example, Au, Ag, Ni, Cu and solder particles; carbon particles; metal-coated resin particles, for example, particles of polyethylene, polypropylene, polyester, polystyrene, polyvinyl alcohol, and modified resins thereof, coated with Au, Ag or Ni; and insulating-treated conductive particles further coated with insulating particles.

The particle size of the conductive particles may be selected within a range of 2 to 30 μm depending on the pitch of circuits to be used and purposes thereof.

The conductive particles may be present in an amount of 0.1 to 10 parts by weight, based on 100 parts by weight of the anisotropic conductive film composition in solid content. Within this range, defective connection and insulation defects due to decrease in an area for connection may be prevented when terminals are misaligned during connection.

The anisotropic conductive film composition may have a melt viscosity of about 2,000 to about 8,000 Pa·s at 80° C. Within this range, the composition may have an excellent flowability, and thus, filling a part with the composition can be smoothly carried out. Also, since thermal deformation by contraction and expansion may be suppressed, fewer bubbles may be generated and excellent adhesion may be exhibited.

If the melt viscosity is more than 2,000 Pa·s at 80° C., it may be possible to avoid or prevent the anisotropic conductive film from having excessive flowability, which may make it difficult for the anisotropic conductive film to fill a connected part, thereby causing generation of bubbles and decrease in adhesion. If the melt viscosity is less than 8,000 Pa·s at 80° C., problems with the pressing of the film not working suitably and problems with connection reliability may be avoided.

According to another embodiment, there is provided a semiconductor device bonded by an anisotropic conductive film, the anisotropic conductive film including, an ethylene-vinyl acetate copolymer, a polyurethane resin, and organic fine particles, wherein the anisotropic conductive film has an adhesive strength of about 1,000 gf/cm or more after pressing at 150° C. and 4 MPa for 4 seconds.

Any suitable method for forming the anisotropic conductive film may be used. No special apparatus or equipment is required to form the anisotropic conductive film. For example, the anisotropic conductive film may be obtained by dissolving and liquefying a binder resin in an organic solvent, adding the remaining ingredients thereto and stirring the solution for a certain period of time, applying the solution to a release film to an appropriate thickness, for example, 10 to 50 μm, and drying the solution to volatilize the organic solvent.

Any suitable method for measuring adhesive strength may be used. For example, adhesive strength may be measured by a peel strength tester (H5KT, Tinius Olsen) at a peeling angle of 90° and a peeling speed of 50 mm/min, after pressing at 150° C. and 4.0 MPa for 4 seconds.

Another embodiment provides a semiconductor device bonded by an anisotropic conductive film that has an adhesive strength of about 800 gf/cm or more after pressing at 150° C. and 4 MPa for 4 seconds and then storage at 85° C. and 85% RH for 500 hours.

The physical properties of the film composition after the storage at 85° C. and 85% RH for 500 hours may be the mean reliability.

Another embodiment provides a semiconductor device bonded by an anisotropic conductive film that has bubble area of 10% or less based on the area of spaces between electrodes after pressing at 150° C. and 4 MPa for 4 seconds and then storage at 85° C. and 85% RH for 500 hours.

The spaces between the electrodes are gaps between electrodes in a PCB that are filled with the anisotropic conductive film composition during pressing.

Any suitable method for measuring the bubble area may be used. For example, the bubble area may be measured by observing (or photographing) spaces between electrodes filled with the film composition using a microscope, followed by calculating the bubble area using an image analyzer or grid coordinates.

If the anisotropic conductive film has bubble area of less than 10%, a semiconductor device connected using the film may be usable over a long period of time and may have a longer lifespan.

The term "bubble area of 10% or less" may denote that the bubble area has a lower limit close to 0, instead of denoting that the bubble area is not formed at all.

According to another embodiment, the semiconductor device may include a wiring substrate, an anisotropic conductive film attached to a chip-mounted side of the wiring substrate, and a semiconductor chip mounted on the film.

The wiring substrate and the semiconductor chip may include any suitable wiring substrate and suitable semiconductor chip.

A method of manufacturing the semiconductor device may include any suitable process.

Hereinafter, embodiments will be described in detail with reference to the following examples, comparative examples and experiment examples. The following examples, comparative examples and experiment examples are provided in order to set forth particular details of one or more embodiments. However, it is to be understood that the embodiments are not limited to the particular details described. Further, the comparative examples are set forth to highlight certain characteristics of certain embodiments, and are not to be construed as either limiting the scope of the invention as exemplified in the examples or as necessarily being outside the scope of the invention in every respect.

Examples 1 to 5

Preparation of an Anisotropic Conductive Film Containing an EVA Copolymer, a Polyurethane Resin and Organic Fine Particles Example 1

An anisotropic conductive film composition was prepared using the following materials:

1) as an EVA copolymer, 20 parts by weight of an EVA copolymer dissolved at 40 vol % in toluene/methyl ethyl ketone (EVA 700, Bayer);

2) as a polyurethane resin, 40 parts by weight of a polyurethane acrylate having a weight average molecular weight of 25,000 g/mol, synthesized using 60 wt % of a polyol (polytetramethylene glycol), 13.53 wt % of 1,4-butanediol, 26.14 wt % of toluene diisocyanate, 0.3 wt % of hydroxyethyl methacrylate and 0.03 wt % of dibutyltin dilaurate as a catalyst; (The method of forming the polyurethane acrylate was as follows: First, the polyol, 1,4-butanediol and toluene diisocyanate were reacted to synthesize a prepolymer having an isocyanate terminal. Then, the prepolymer having the isocyanate terminal was reacted with hydroxyethyl methacrylate to produce a polyurethane acrylate resin. Polymerization was carried out with a 0.5 molar ratio of hydroxyethyl methacrylate/isocyanate at a terminal of the prepolymer, and at 90° C. and 1 atm for 5 hours using dibutyltin dilaurate as a catalyst, thereby producing the polyurethane acrylate having a weight average molecular weight of 25,000 g/mol.)

3) as organic fine particles, 15 parts by weight of a styrene-butadiene thermoplastic elastomer (ASAPRENE 420P, Asahi Kasei Chemicals);

4) as an acrylic copolymer, 10 parts by weight of an acrylic resin having a weight average molecular weight of 100,000 g/mol (AOF7003, Aekyung Chemical) dissolved at 45 vol % in toluene/methyl ethyl ketone;

5) as a radical polymerizable material, 10 parts by weight of an epoxy acrylate polymer (SP1509, Showa Highpolymer);

6) as an organic peroxide, 2 parts by weight of benzoyl peroxide (Hansol Chemical); and 7) as conductive particles, 3 parts by weight of conductive Ni particles having a particle size of 5 μm;

based on 100 parts by weight of the anisotropic conductive film composition in solid content.

The combination was stirred at a rate at which the conductive particles were not pulverized, at room temperature (25° C.) for 60 minutes. The combination was formed into a 35 μm thick film on a polyethylene base film, which had been subjected to a silicone release surface treatment, using a casting knife. The film was dried at 60° C. for 5 minutes.

Example 2

An anisotropic conductive film was prepared in the same manner as in Example 1, except that 30 parts by weight of the EVA copolymer and 5 parts by weight of the organic fine particles were used.

Example 3

An anisotropic conductive film was prepared in the same manner as in Example 1, except that 40 parts by weight of the EVA copolymer, 30 parts by weight of the polyurethane resin and 5 parts by weight of the organic fine particles were used.

Example 4

An anisotropic conductive film was prepared in the same manner as in Example 1, except that 35 parts by weight of the EVA copolymer, 30 parts by weight of the polyurethane resin and 10 parts by weight of the organic fine particles were used.

Example 5

An anisotropic conductive film was prepared in the same manner as in Example 1, except that 1 part by weight of the organic fine particles, 18 parts by weight of the acrylic copolymer and 16 parts by weight of the radical polymerizable material were used.

Comparative Example 1

Preparation of Anisotropic Conductive Film not Containing Organic Fine Particles An anisotropic conductive film was prepared in the same manner as in Example 1, except that the organic fine particles were not added and 20 parts by weight of the acrylic copolymer and 15 parts by weight of the radical polymerizable material were used.

Comparative Example 2

Preparation of Anisotropic Conductive Film not Containing EVA Copolymer and Organic Fine Particles An anisotropic conductive film was prepared in the same manner as in Comparative Example 1, except that an acrylonitrile butadiene copolymer (1072CGX, Zeon Chemical) dissolved at 25 vol % in toluene/methyl ethyl ketone was used as a thermoplastic resin instead of the EVA copolymer.

Comparative Example 3

Preparation of Anisotropic Conductive Film not Containing EVA Copolymer and Organic Fine Particles An anisotropic conductive film was prepared in the same manner as in Example 1, except that the EVA copolymer and the organic fine particles were not added, and 30 parts by weight of the polyurethane resin and 40 parts by weight of an acrylonitrile butadiene copolymer (1072CGX, Zeon Chemical) dissolved at 25 vol % in toluene/methyl ethyl ketone as a thermoplastic resin were used.

Compositions used in Examples 1 to 5 and Comparative Examples 1 to 3 are listed based on parts by weight in Table 1 and 2.

TABLE 1

| | Example 1 | Example 2 | Example 3 | Example 4 | Example 5 |
|---|---|---|---|---|---|
| Ethylene-vinyl acrylate | 20 | 30 | 40 | 35 | 20 |
| Polyurethane resin | 40 | 40 | 30 | 30 | 40 |
| Organic particles | 15 | 5 | 5 | 10 | 1 |
| Thermoplastic resin | — | — | — | — | — |
| Acrylic copolymer | 10 | 10 | 10 | 10 | 18 |
| Radical polymerizable material | 10 | 10 | 10 | 10 | 16 |
| Organic peroxide | 2 | 2 | 2 | 2 | 2 |
| Conductive particles | 3 | 3 | 3 | 3 | 3 |
| Total | 100 | 100 | 100 | 100 | 100 |

TABLE 2

| | Comparative Example 1 | Comparative Example 2 | Comparative Example 3 |
|---|---|---|---|
| Ethylene-vinyl acrylate | 20 | — | — |
| Polyurethane resin | 40 | 40 | 35 |
| Organic particles | — | — | — |
| Thermoplastic resin | — | 20 | 40 |
| Acrylic copolymer | 20 | 20 | 10 |
| Radical polymerizable material | 15 | 15 | 10 |
| Organic peroxide | 2 | 2 | 2 |
| Conductive particles | 3 | 3 | 3 |
| Total | 100 | 100 | 100 |

Experimental Example 1

Measurement of Melt Viscosity

To measure the melt viscosity of each of the anisotropic conductive films according to Examples 1 to 5 and Comparative Examples 1 to 3, each film was prepared to a thickness of 140 μm and evaluated as to viscosity at 80° C. using an ARES rheometer (ARES G2, TA Instruments) while elevating the temperature from 30 to 220° C. at 10° C./min (Strain: 5%, Frequency: 1 rad/s, Diameter of parallel plate and aluminum disposable plate: 8 mm).

Experimental Example 2

Measurement of Initial Adhesive Strength and Adhesive Strength after Reliability Testing To measure the adhesive strength of each of the anisotropic conductive films according to Examples 1 to 5 and Comparative Examples 1 to 3, each film was attached to a printed circuit board (PCB, pitch: 200 μm, terminal: 100 μm, distance between terminals: 100 μm, terminal height: 35 μm) and to a chip on film (COF, pitch: 200 μm, terminal: 100 μm, distance between terminals: 100 μm, terminal height: 8 μm) under the following conditions.

1) Preliminary pressing: 70° C., 1 second, 1.0 MPa
2) Final pressing: 150° C., 4 seconds, 4.0 MPa Five specimens of each film attached as above were prepared and evaluated as to adhesive strength at a peeling angle of 90° and a peeling speed of 50 mm/min using a peel strength tester (H5KT, Tinius Olsen), followed by calculation of an average value.

The five specimens of each film were subjected to reliability testing under high temperature and humidity (storage at 85° C. and 85% RH for 500 hours) and evaluated as to adhesive strength after reliability testing in the same manner as above.

Experimental Example 3

Measurement of Initial Connection Resistance and Connection Resistance after Reliability Testing To measure the connection resistance of each of the anisotropic conductive films according to Examples 1 to 5 and Comparative Examples 1 to 3, each film was attached to a PCB (pitch: 200 μm, terminal: 100 μm, distance between terminals: 100 μm, terminal height: 35 μm) and to a COF (pitch: 200 μm, terminal: 100 μm, distance between terminals: 100 μm, terminal height: 8 μm) under the following conditions.
1) Preliminary pressing: 70° C., 1 second, 1.0 MPa
2) Final pressing: 200° C., 4 seconds, 4.0 MPa Five specimens of each film attached as above were prepared and evaluated as to initial connection resistance using a 4-probe method (according to ASTM F43-64T), followed by calculation of an average value.

The five specimens of each film were subjected to reliability testing under high temperature and humidity (storage at 85° C. and 85% RH for 500 hours) and evaluated as to connection resistance after reliability testing (according to ASTM D117), followed by calculation of an average value.

Experimental Example 4

Measurement of Initial Area of Bubbles and Area of Bubbles after Reliability Testing To measure the area of bubbles generated in each of the anisotropic conductive films according to Examples 1 to 5 and Comparative Examples 1 to 3, each film was attached to a PCB (pitch: 200 μm, terminal: 100 μm, distance between terminals: 100 μm, terminal height: 35 μm) and to a chip on film (COF, pitch: 200 μm, terminal: 100 μm, distance between terminals: 100 μm, terminal height: 8 μm) under the following conditions.
1) Preliminary pressing: 70° C., 1 second, 1.0 MPa
2) Final pressing: 200° C., 4 seconds, 4.0 MPa
Five specimens of each film attached as above were prepared. After taking pictures of 10 spots of each specimen using an optical microscope, the area of bubbles generated in spaces between electrodes was measured using an image analyzer, followed by calculation of an average value.

The five specimens of each film were subjected to reliability testing under high temperature and humidity (storage at 85° C. and 85% RH for 500 hours) and evaluated as to the area of bubbles in the same manner as above, followed by calculation of an average value.

Experimental Example 5

Evaluation of Solution Stability

To evaluate the solution stability of each of the anisotropic conductive film compositions according to Examples 1 to 5 and Comparative Examples 1 to 3, each composition was stirred at 140 rpm at room temperature (25° C.) for 60 minutes such that the conductive particles were not pulverized. Then, the product was subdivided into 50 g samples, placed in vials and observed with the naked eye to measure a time when phase separation occurred.

Results of Experimental Examples 1 to 5 are illustrated in Tables 3 and 4.

TABLE 3

| | | Example 1 | Example 2 | Example 3 | Example 4 | Example 5 |
|---|---|---|---|---|---|---|
| Melt viscosity (Pa · s) | | 6320 | 4320 | 3533 | 5840 | 2540 |
| Adhesive strength (gf/cm) | Initial | 1230 | 1080 | 1130 | 1228 | 970 |
| | After reliability testing | 1088 | 992 | 1001 | 1015 | 893 |
| Connection resistance (Ω) | Initial | 0.0024 | 0.024 | 0.023 | 0.022 | 0.028 |
| | After reliability testing | 0.034 | 0.033 | 0.038 | 0.031 | 00062 |
| Bubble area (%) | Initial | 0 | 4 | 3 | 3 | 5 |
| | After reliability testing | 0 | 4 | 3 | 3 | 10 |
| Solution stability (hrs) | | 12 | 10 | 8 | 9 | 6 |

TABLE 4

| | | Comparative Example 1 | Comparative Example 2 | Comparative Example 3 |
|---|---|---|---|---|
| Melt viscosity (Pa · s) | | 980 | 1350 | 9560 |
| Adhesive strength (gf/cm) | Initial | 856 | 830 | 952 |
| | After reliability testing | 578 | 533 | 672 |
| Connection resistance (Ω) | Initial | 0.024 | 0.031 | 0.105 |
| | After reliability testing | 0.083 | 0.134 | 0.456 |
| Bubble area (%) | Initial | 15 | 17 | 12 |
| | After reliability testing | 27 | 33 | 17 |
| Solution stability (hrs) | | 3 | 5 | 5 |

As shown in Tables 3 and 4, it can be seen that the anisotropic conductive films including the EVA, the polyurethane resin and the organic particles according to Examples 1 to 5 had superior physical properties, for example, adhesive strength, connection resistance and bubble area, as compared to the anisotropic conductive films not including the EVA and the organic particles according to Comparative Examples 1 to 3.

Further, it could be seen that the anisotropic conductive films containing the EVA had a lower melt viscosity and thus exhibited excellent flowability at a low temperature. Also, the anisotropic conductive films including the EVA, the polyurethane resin and the organic particles according to Examples 1 to 5 had remarkably excellent solution stability, as compared with the anisotropic conductive films according to Comparative Examples 1 to 3.

Here, it could also be seen that the anisotropic conductive film including 1 part by weight of the organic fine particles according to Example 5 was excellent in terms of melt viscosity, adhesive strength, connection resistance, solution stability and initial bubble area, but had a slightly larger area of bubbles after reliability testing than the other examples. The reason is considered to be that a relatively small amount of organic particles provided a low effect of controlling the viscosity.

By way of summation and review, when an anisotropic conductive film is disposed between circuit boards or other devices to be connected and is subjected to heating and pressing under particular conditions, circuit terminals of the circuit boards may be electrically connected through conductive particles and an insulating adhesive resin may be filled in spaces between adjacent circuit terminals to isolate the conductive particles from each other, thereby providing high insulation performance between the circuit terminals.

With the growing trend towards large panels and enlarged wires, spaces between electrodes become wider. Thus, as connection substrates expand due to pressing by heat and pressure in bonding and then contract back after bonding, an adhesive composition may expand and contract to a serious degree, causing the generation of a great number of bubbles and deterioration in filling effects of the adhesive composition.

To address such problems, one approach is to use a binder resin having a high glass transition temperature (Tg). However, even in the case where the film is configured to withstand contraction and expansion by heat, filling of the film may not be smoothly achieved due to low flowability of the resin. Thus, an unfilled part may remain, causing severe bubbles.

According to embodiments, an anisotropic conductive film may include an ethylene-vinyl acetate copolymer, a polyurethane resin, and organic particles to have good flowability. Such an anisotropic conductive film may provide smooth filling of the film composition, suppressing thermal deformation by contraction and expansion to generate fewer bubbles, and exhibiting excellent adhesion. The anisotropic conductive film composition may include ethylene-vinyl acetate copolymer to have a low melt viscosity, thus smoothly filling a gap between electrodes due to high flowability at a low temperature. In addition, anisotropic conductive film composition may include a polyurethane resin and organic fine particles along with the ethylene-vinyl acetate copolymer to control the viscosity of the film composition, thereby providing a smaller area of bubbles and providing excellent adhesion after final pressing.

Further, the anisotropic conductive film composition may be resistant to thermal deformation by contraction and expansion, thereby maintaining the area of bubbles and adhesion within desired range even under storage at high temperature and humidity for long time, thereby providing excellent reliability.

A semiconductor device may be bonded by the film including the ethylene-vinyl acetate copolymer, polyurethane resin, and organic fine particles.

Example embodiments have been disclosed herein, and although specific terms are employed, they are used and are to be interpreted in a generic and descriptive sense only and not for purpose of limitation. Accordingly, it will be understood by those of skill in the art that various changes in form and details may be made without departing from the spirit and scope of the present invention as set forth in the following claims.

What is claimed is:

1. A panel device bonded by an anisotropic conductive film, the anisotropic conductive film comprising:
   an ethylene-vinyl acetate copolymer;
   a polyurethane resin;
   conductive particles; and
   organic fine particles;
   wherein the anisotropic conductive film has a melt viscosity of about 2,000 to about 8,000 Pa·s at 80° C.,
   wherein, after the anisotropic conductive film is pressed between electrodes on a substrate at 150° C. and 4 MPa for 4 seconds and then stored at 85° C. and 85% RH for 500 hours, the anisotropic conductive film has a bubble area of 10% or less based on an area of spaces between the electrodes.

2. The panel device as claimed in claim 1, wherein the anisotropic conductive film includes:
   about 5 to about 50 parts by weight of the ethylene-vinyl acetate copolymer;
   about 10 to about 70 parts by weight of the polyurethane resin;
   about 0.1 to about 10 parts by weight of the conductive particles; and
   about 0.1 to about 30 parts by weight of the organic fine particles;
   based on 100 parts by weight of a solid content of the anisotropic conductive film.

3. The panel device as claimed in claim 1, wherein the organic fine particles include organic fine particles of at least one of styrene-divinylbenzene, chlorinated polyethylene, dimethyl polysiloxane, methylmethacrylate-butylacrylate-dimethylsiloxane copolymers, styrene-butadiene-styrene block copolymers, styrene-butadiene thermoplastic elastomers, butadiene rubbers, styrene-butadiene rubbers, and ethylene glycidyl methacrylate.

4. A panel device bonded by an anisotropic conductive film, the anisotropic conductive film including:
   an ethylene-vinyl acetate copolymer;
   a polyurethane resin;
   conductive particles; and
   organic fine particles;
   wherein the anisotropic conductive film has an initial adhesive strength of about 1,000 gf/cm or more after pressing at 150° C. and 4 MPa for 4 seconds,
   wherein, after the anisotropic conductive film is pressed between electrodes on a substrate at 150° C. and 4 MPa for 4 seconds and then stored at 85° C. and 85% RH for 500 hours, the anisotropic conductive film has a bubble area of 10% or less based on an area of spaces between the electrodes.

5. The panel device as claimed in claim 4, wherein the organic fine particles include organic fine particles of at least one of styrene-divinylbenzene, chlorinated polyethylene, dimethyl polysiloxane, methylmethacrylate-butylacrylate-dimethylsiloxane copolymers, styrene-butadiene-styrene block copolymers, styrene-butadiene thermoplastic elastomers, butadiene rubbers, styrene-butadiene rubbers, and ethylene glycidyl methacrylate.

6. The panel device as claimed in claim 4, wherein the anisotropic conductive film has an adhesive strength of about 800 gf/cm or more after reliability testing by pressing at 150° C. and 4 MPa for 4 seconds and then storing at 85° C. and 85% RH for 500 hours.

7. The panel device as claimed in claim 4, wherein the anisotropic conductive film has a melt viscosity of about 2,000 to about 8,000 Pa·s at 80° C.

* * * * *